US006203365B1

(12) United States Patent
Wu

(10) Patent No.: US 6,203,365 B1
(45) Date of Patent: Mar. 20, 2001

(54) MULTI-PORT RECEPTACLE CONNECTOR UNIT

(75) Inventor: Kun-Tsan Wu, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/328,041

(22) Filed: Jun. 8, 1999

(30) Foreign Application Priority Data

Sep. 8, 1998 (TW) ........................................ 87214848

(51) Int. Cl.$^{7}$ .......................... H01R 13/60; H01R 13/66; H01R 12/00; H05K 1/00; H05K 13/648

(52) U.S. Cl. ......................... 439/540.1; 439/61; 439/607; 439/636

(58) Field of Search ................................... 439/61, 540.1, 439/607, 636

(56) References Cited

U.S. PATENT DOCUMENTS

| | | | | |
|---|---|---|---|---|
| 5,263,867 | * | 11/1993 | Doi et al. | 439/636 |
| 5,697,799 | * | 12/1997 | Consoli et al. | 439/607 |
| 5,863,222 | * | 1/1999 | Kinsey, Jr. et al. | 439/607 |
| 5,876,245 | * | 3/1999 | Tomita et al. | 439/540.1 |

* cited by examiner

*Primary Examiner*—Paula Bradley
*Assistant Examiner*—Edwin A. León
(74) *Attorney, Agent, or Firm*—Wei Te Chung

(57) ABSTRACT

A multiple-port receptacle connector unit comprises two parallel insulative housings connected to each other at respective ends thereof via two bridge portions thus defining a space therebetween. Each insulative housing defines a mating port along a lengthwise direction thereof and comprises at least one row of surface mount contacts each of which has a contacting portion vertically exposing to the mating port and a soldering portion horizontally exposing to external from a bottom of the insulative housing.

2 Claims, 6 Drawing Sheets

MULTI-PORT RECEPTACLE CONNECTOR UNIT

BACKGROUND OF THE INVENTION

1. Field of the Invention

The present invention relates to a multi-port receptacle connector unit, especially a multi-port receptacle connector unit allowing external devices to be located between spaced ports thereof.

2. The Prior Art

Single port receptacle connectors have been used to connect an external device to a printed circuit board for years. These connectors can be referred to Taiwan patent application Nos. 84112993, 85103740, 85203116, and 86206353. Due to the high data capacity requirement, a single-port connector is not enough to support the transmission of high capacity of data, therefore, at least two receptacle connectors are needed to meet larger capacity requirement from external devices. Therefore, it is requisite to provide a new receptacle connector unit comprising at least two ports equaling the capacity of two separate single-port connectors. However, if the connector unit is short of a metal shielding, an EMI problem may exist and affect the transmission fidelity of signals. Moreover, the connectors usually have a grounding contact resistance beyond the acceptable level and cause additional impedance especially in a high frequency environment.

It is requisite to provide a multiple-port receptacle connector unit for meeting higher capacity requirement and preferably the connector unit includes a metal shielding for eliminating the EMI problem.

SUMMARY OF THE INVENTION

The primary purpose of the present invention is to provide a multi-port receptacle connector for meeting larger capacity requirement than a single port receptacle connector.

The second purpose of the present invention is to provide a multi-port receptacle connector unit having metal shielding to eliminate EMI problem.

The third purpose of the present invention is to provide a multi-port receptacle connector unit having metal shielding which can provide at least a further grounding path to a printed circuit board thus effectively reducing the contacting ground resistance.

In accordance with one aspect of the present invention, a multiple-port receptacle connector unit comprises two parallel insulative housings connected to each other at respective ends thereof via two bridge portions thus defining a space therebetween. Each insulative housing defines a mating port along a lengthwise direction thereof and comprises at least one row of surface mount contacts each of which has a contacting portion vertically exposing to the mating port and a soldering portion horizontally exposing to external from a bottom of the insulative housing.

In accordance with another aspect of the present invention, a multiple-port receptacle connector unit comprises a first pair of parallel insulative housings and a second pair of parallel insulative housings connected to each other at respective ends thereof thus forming a square structure and defining a space in the square structure. Each insulative housing defines a mating port along a lengthwise direction thereof and comprises at least one row of surface mount contacts each of which has a contacting portion vertically exposing to the mating port and a soldering portion horizontally exposing to external from a bottom of the insulative housing.

DETAILED DESCRIPTION OF THE PREFERRED EMBODIMENT

Figure 1:
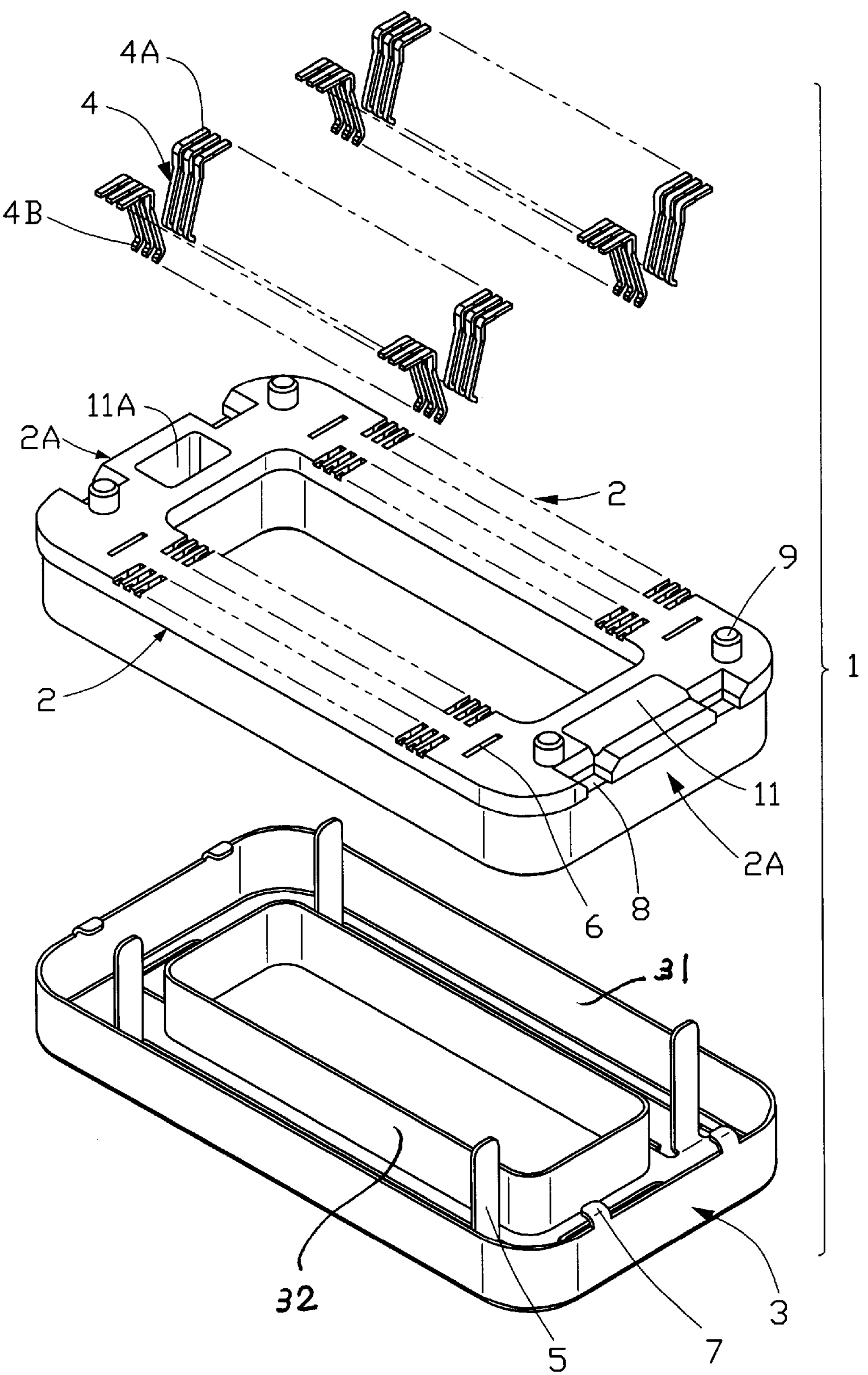
FIG. 1 is an exploded view of a multi-port receptacle connector in accordance with a first embodiment of the present invention.
Figure 2:
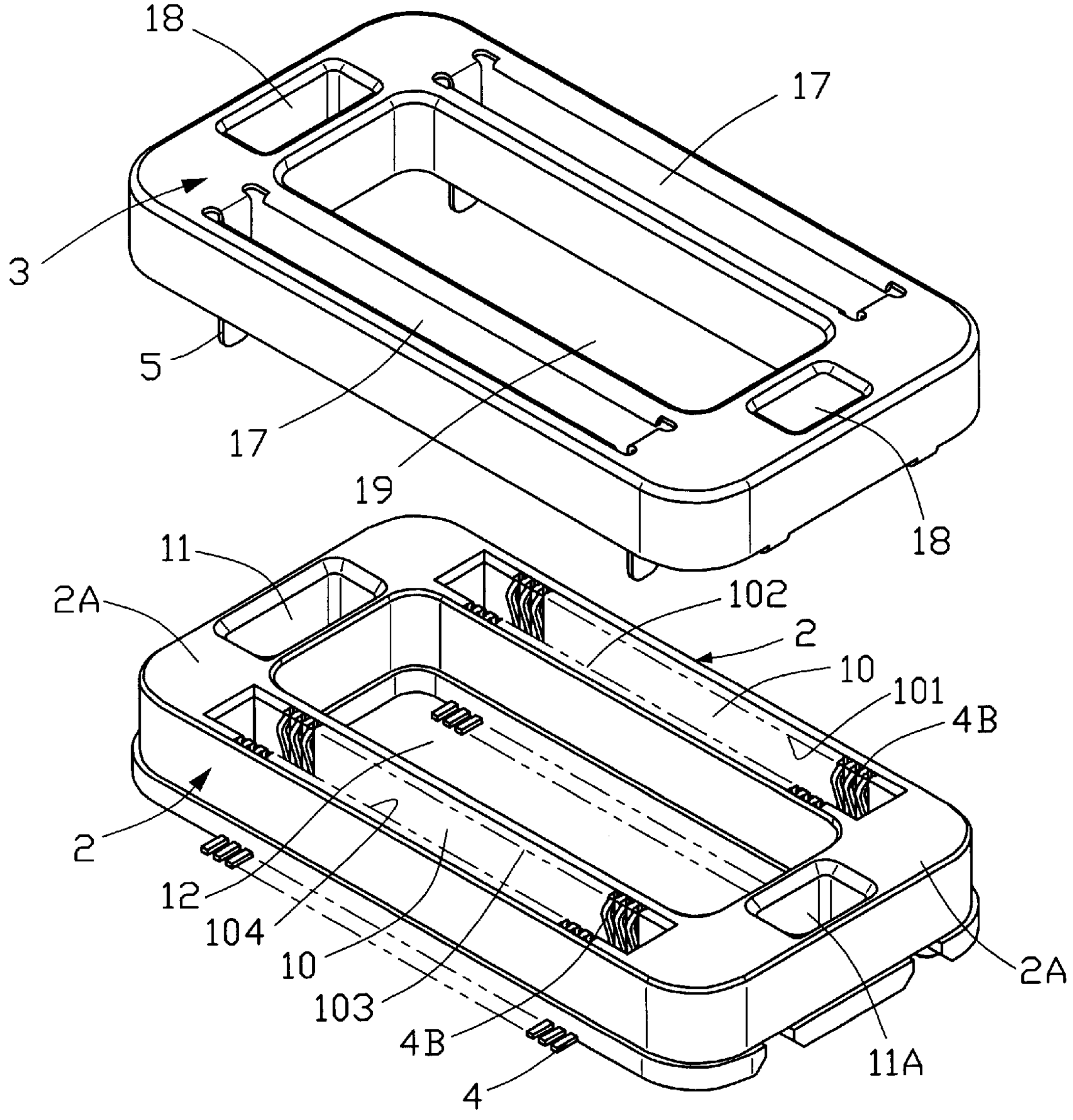
FIG. 2 is another view of FIG. 1 taken from a different angle with the contacts being configured in the housing.

Referring to FIGS. 1 and 2, a multi-port receptacle unit 1 in accordance with a first embodiment of the present invention comprises two parallel insulative housings 2 connected to each other at respective ends thereof via two bridge portions 2A thus forming a rectangular structure defining a space 12 therein. Each insulative housing 2 defines a mating port 10 along a lengthwise direction thereof. Two rows of surface mount contacts 4 are configured in opposite inner walls 101, 102 (or 103, 104) of each mating port 10. Each contact 4 has a soldering portion 4A horizontally exposing to external from a bottom of the insulative housing 2 ready for soldering to a printed circuit board (not shown) and a contacting portion 4B connected to the soldering portion 4A and vertically exposing to the mating port 10 for electrically and mechanically connecting to corresponding contact in a complementary connector.

A metal shielding 3 has a mating structure to the rectangular structure (the housings 2 and the bridging portions 2A) for covering most parts thereof except the bottom and the inner walls of each housing 2. The metal shielding 3 comprises four lugs 5 extending therefrom downward through slits 6 defined in the bottom of the housings 2 for being soldered onto a grounding trace of an external printed circuit board (not shown) thereby decreasing grounding contact resistance between the connector unit 1 and the printed circuit board. Each slit 6 communicates with the mating port 10 therefore an inner periphery of the mating port 10 and the slit 6 together constitute a passageway for the lug 5.

A relatively large hole 11 and a relatively small hole 11A are respectively formed in the bridging portions 2A functioning as keyways for preventing disorientation of a complementary connector unit (not shown) connected thereto. Particularly referring to FIG. 1, each housing 2 has two posts 9 extending from a bottom thereof for positioning the connector unit 1 in the printed circuit board (now shown).

Figure 3:
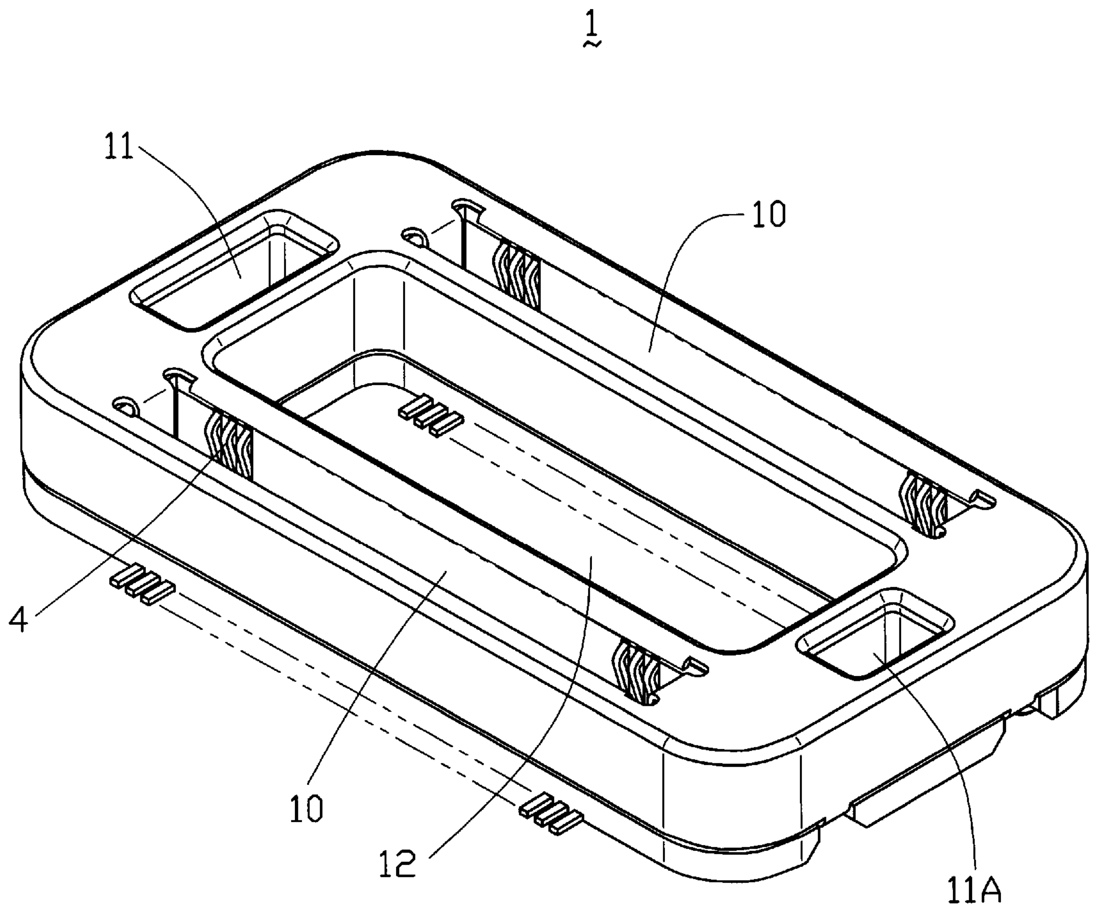
FIG. 3 is an assembled view of FIG. 2.

The metal shielding 3 has four engagement tabs 7 extending laterally therefrom for being engaged within corresponding reception grooves 8 formed in opposite sides of the connector unit 1. The metal shielding 3 further includes a pair of openings 18 in alignment with the corresponding holes 11/11A of the housing 2, a pair of openings 17 in alignment with the corresponding mating ports 10 of the housing 2, and a central opening 19 in alignment with the space 12 of the housing 2. It is noted that the shielding 3 includes an outer periphery wall 31 surrounding the contour of the housings 2 and the bridge portions 2A, cooperating with an inner circumferential wall 32 surrounding the space 12, so as to shield the housings 2 therebetween as shown in FIG. 3.

Figure 4:
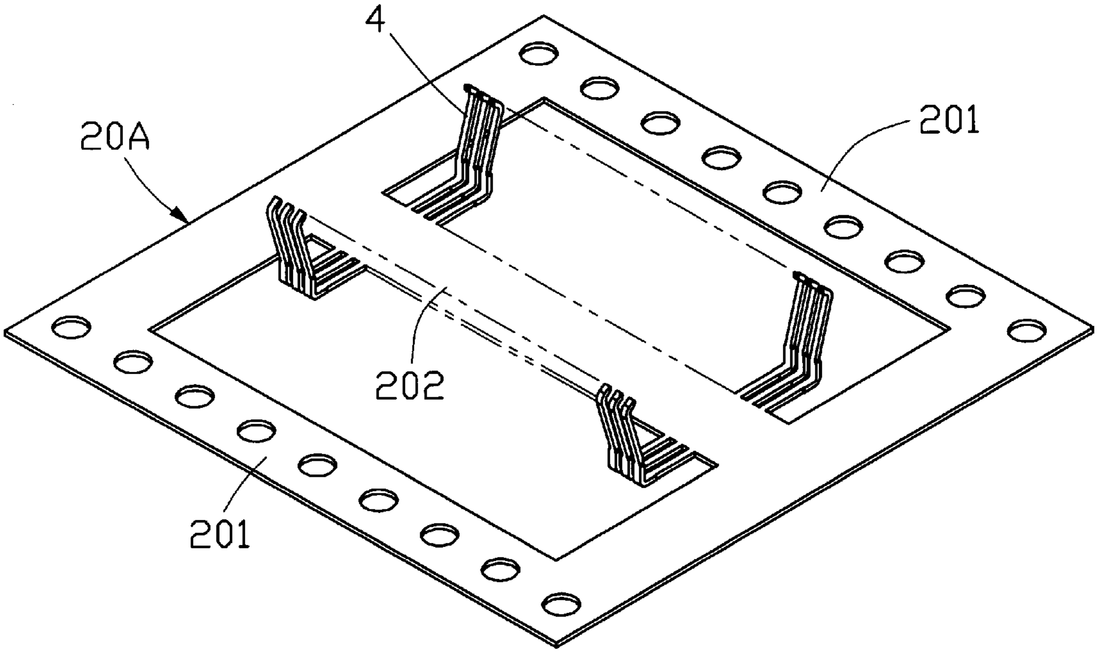
FIG. 4 is a first reel having two rows of contacts used in the present invention.

Referring to FIG. 4, a first reel 20A comprises two roller tapes 201 and a carrier tape 202 substantially parallel to the roller tapes 201 and two rows of contacts 4 extend from opposite sides of the carrier tape 202. The rows of contacts 4 may be simultaneously loaded to inner walls 102, 103 of different housings 2.

Figure 5:
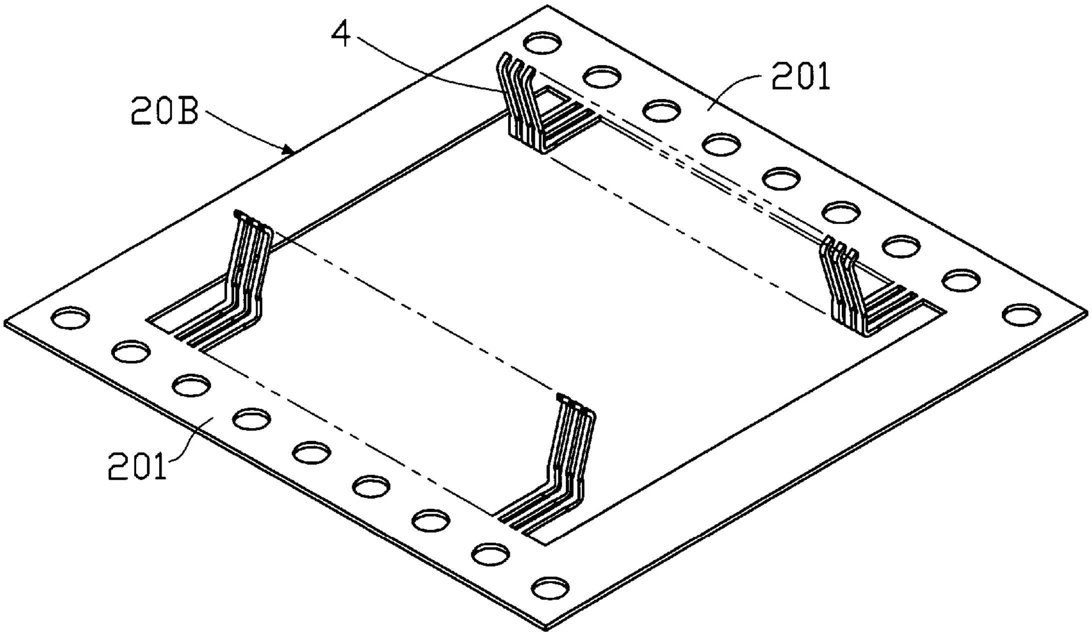
FIG. 5 is a second reel having two rows of contacts used in the present invention.

Referring to FIG. 5, a second reel 20B comprises two roller tapes 201 parallel to each other and two rows of contacts 4 extending from opposing sides of the roller tapes 201. The rows of contacts 4 may be simultaneously loaded to inner walls 101, 104 of different housings 2.

Figure 6:
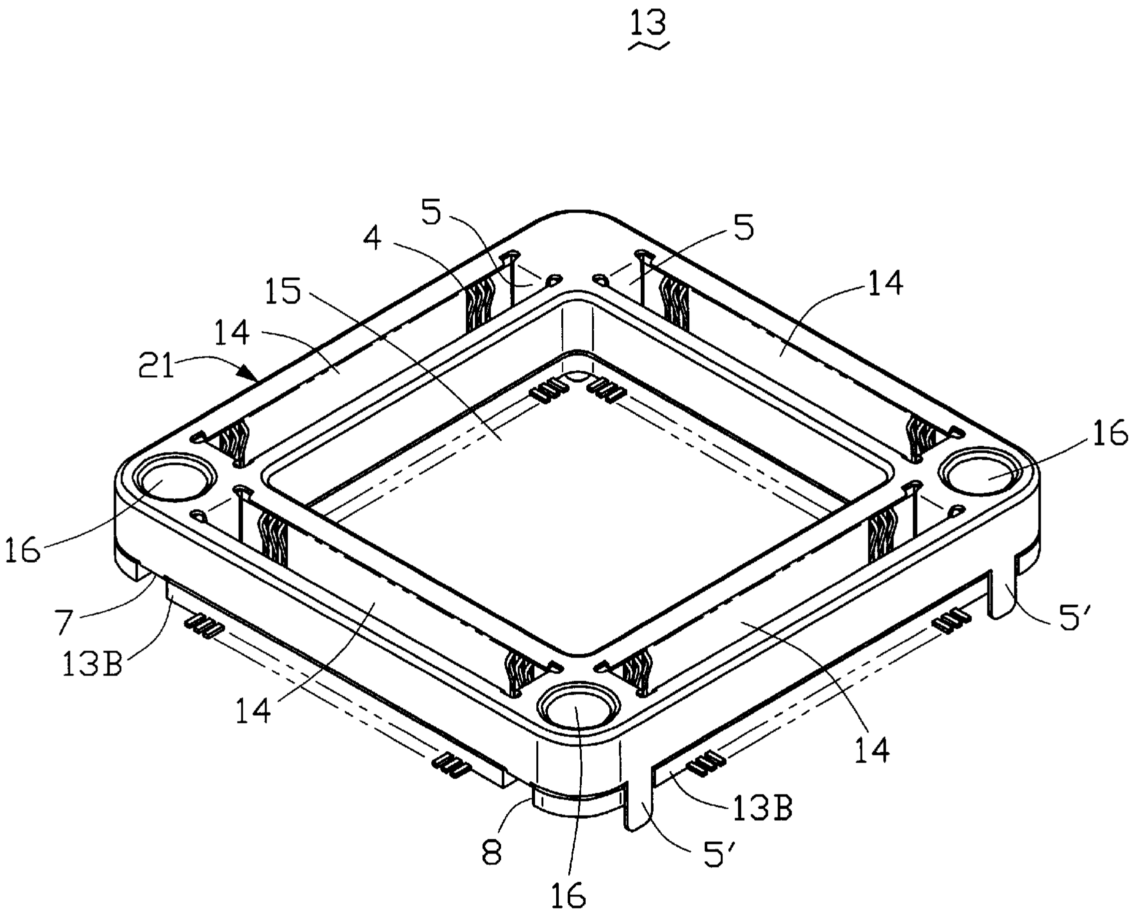
FIG. 6 is a second embodiment of a multi-port receptacle connector unit in accordance with the present invention.

The above mentioned receptacle connector unit 1 may be improved to contain four ports as shown in FIG. 6. FIG. 6 illustrates a second embodiment of a multi-port receptacle connector 13 comprises four housings 13B connected to each other thus forming a square structure and defining a space 15 therein. Similar to the first embodiment, each housing 13B has a mating port 14 defined along a lengthwise direction thereof. A metal shielding 21 matingly cover most of the square structure of the housings 13B. Each housing 13B has exactly the same structure as that of the housing 2 of the first embodiment. Similar to the metal shielding 3 of the first embodiment, the metal shielding 21 also has lugs 5 for grounding purpose. The metal shielding 21 further comprises additional lugs 5' extending from outer periphery thereof attaching to outer periphery of each housing 13B without passing through the ports 14 thereof. These additional lugs 5' can further decrease grounding contact resistance when they are connected to the ground trace of the printed circuit board (not shown). Three holes 16 are formed in three corners of the square connector unit 13 functioning as keyways for prevention of disorientation of a complementary connector unit (not shown) connected to the connector unit 13. Alternatively, the disorientation may be achieved by forming one hole in only one of the four corners.

While the present invention has been described with reference to a specific embodiment, the description is illustrative of the invention and is not to be construed as limiting the invention. Therefore, various modifications to the present invention can be made to the preferred embodiment by those skilled in the art without departing from the true spirit and scope of the invention as defined by the appended claims.

What is claimed is:

1. A multiple-port receptacle connector unit comprising:

two parallel insulative housings connected to each other at respective ends thereof via two bridge portions thus defining a space therebetween, each insulative housing defining a mating port along a lengthwise direction thereof and comprising at least one row of surface mount contacts each of which has a vertically extending contacting portion exposing to the mating port and a horizontally extending soldering portion exposing to an exterior around a bottom of the insulative housing; and a metal shielding covering most of the connector unit except the at least one row of surface mount contacts and comprising a lug extending through a passageway defined in the insulative housing downward to the bottom of the insulative housing for being soldered onto a grounding pad of an external printed circuit board; wherein the metal shielding has a height less than the height of the receptacle connector unit; wherein a relatively large hole and a relatively small hole are respectively formed in the bridging portions of the receptacle connector unit for preventing disorientation of a complementary connector adapted to be connected thereto; wherein each housing has at least one post extending from a bottom thereof for positioning the connector unit in a printed circuit board; wherein the metal shielding has at least one engagement tab extending laterally therefrom for being engaged within at least one reception groove formed in a periphery of the connector unit.

2. A multiple-port receptacle connector unit comprising a first pair of parallel insulative housings and a second pair of parallel insulative housings connected to each other at respectively ends thereof thus forming a square structure and defining a mating port along a lengthwise direction thereof and comprising at least one row of surface mount contacts each of which has a vertically extending contacting portion exposing to the mating port and a horizontally extending soldering portion exposing to an exterior around a bottom of the insulative housing wherein the connector unit filter comprises a metal shielding having a height less than the height of the receptacle connector unit and shaped as a mating structure to cover most of the connector unit except the at least one row of surface mount contacts; wherein the metal shielding comprising at least one lug extending therefrom downward to the bottom of the insulative housing for being soldered onto a grounding pad of an external printed circuit board thereby decreasing rounding contact resistance between the connector unit and the printed circuit board; wherein at least one of the insulative housing forms a passageway therein allowing the at least one lug of the metal shielding to extend therethrough; wherein only three of four corners of the connector unit are each formed with a keyway for preventing disorientation of a complementary connector unit adapted to be connected thereto; wherein each housing has at least one post extending from a bottom thereof for positioning the connector unit on a printed circuit board.

* * * * *